US008553909B2

(12) United States Patent
Fortier et al.

(10) Patent No.: US 8,553,909 B2
(45) Date of Patent: Oct. 8, 2013

(54) LOW-POWER CLASS D AMPLIFIER USING MULTISTATE ANALOG FEEDBACK LOOPS

(75) Inventors: Justin L. Fortier, Carleton Place (CA); Ralph D. Mason, Ottawa (CA); Renyuan Li, Ottawa (CA); Christopher A. DeVries, Ottawa (CA); Peter H. R. Popplewell, Ottawa (CA); William Kung, Stittsville (CA)

(73) Assignee: SMSC Holdings S.A.R.L., Luxembourg (LU)

( * ) Notice: Subject to any disclaimer, the term of this patent is extended or adjusted under 35 U.S.C. 154(b) by 339 days.

(21) Appl. No.: 13/097,690

(22) Filed: Apr. 29, 2011

(65) Prior Publication Data

US 2012/0275493 A1 Nov. 1, 2012

(51) Int. Cl.
 *H03F 99/00* (2009.01)
(52) U.S. Cl.
 USPC ............... 381/120; 381/28; 330/10; 330/251; 330/207 A; 700/94
(58) Field of Classification Search
 USPC ............ 381/28, 120, 94.1, 94.5; 330/251, 10, 330/207 A; 700/94
 See application file for complete search history.

(56) References Cited

U.S. PATENT DOCUMENTS

| 5,063,332 | A | 11/1991 | El-Hamamsy et al. |
| 5,118,997 | A | 6/1992 | El-Hamamsy |
| 5,410,592 | A | 4/1995 | Wagner et al. |
| 5,796,302 | A | 8/1998 | Masini et al. |
| 5,815,581 | A | 9/1998 | Andersson |
| 5,949,282 | A | 9/1999 | Nguyen et al. |
| 6,759,899 | B2 | 7/2004 | Lennartson et al. |
| 6,952,131 | B2 | 10/2005 | Jeong et al. |
| 7,046,727 | B2 | 5/2006 | Takagishi |
| 7,394,314 | B2 | 7/2008 | May |
| 7,456,685 | B2 | 11/2008 | Chen |
| 7,528,653 | B2 | 5/2009 | May |
| 7,679,435 | B2 * | 3/2010 | Tsuji et al. .................... 330/251 |
| 7,911,268 | B2 | 3/2011 | Chang et al. |
| 7,982,536 | B2 | 7/2011 | Chao |
| 7,994,853 | B2 | 8/2011 | Chao |
| 2010/0321570 | A1 | 12/2010 | Odagiri |

OTHER PUBLICATIONS

Ido, et al., "A Digital Input Controller for Audio Class-D Amplifiers with 100W 0.004% THD+N and 113dBDR," ISSCC 2006/Session 19/Analog Techniques/19.3, 2006 IEEE International Solid-State Circuits Conference, Feb. 7, 2006, 10 pages.

* cited by examiner

*Primary Examiner* — Vivian Chin
*Assistant Examiner* — Paul Kim
(74) *Attorney, Agent, or Firm* — King & Spalding L.L.P.

(57) ABSTRACT

An audio amplifier system may include an audio CODEC/ output (AOP) path featuring analog class-D amplifiers, and using Natural Sampling Pulse Width Modulation (PWM) to convert an analog input into a series of Rail-to-Rail pulses. The audio signal may be encoded in the average value of the PWM pulse train and may be recovered from the PWM signal by analog low pass filtering. The Class-D amplifiers may be designed with a negative feedback loop/network to compare the output signal with the input signal and suppress non-idealities introduced by the Class-D switching stage. Furthermore, operation of the AOP may be designed according to a separate signal transfer function and a separate noise transfer function, and $2^{nd}$ order noise shaping may be performed at low power, with an optimized filter included in the feedback loop to achieve the best noise reduction at low power. Operation of the amplifier feedback network may be similar to that of a continuous time, low-pass delta-sigma modulator, but with a PWM loop wrapped around the class-D power amplifier.

26 Claims, 4 Drawing Sheets

LOW-POWER CLASS D AMPLIFIER USING MULTISTATE ANALOG FEEDBACK LOOPS

BACKGROUND OF THE INVENTION

1. Field of the Invention

This invention relates to radio frequency transceiver design, and, more particularly, to the design of a class D amplifier in a radio frequency transmitter.

2. Description of the Related Art

Radio frequency (RF) transmitters/receivers are used in a wide variety of applications, including wireless network interfaces, mobile telephones, and Bluetooth interfaces. RF transceivers also feature prominently in wireless audio technology directed to headphones and earphones, home audio/theater systems and speakers, portable audio/media players and automotive sound systems. Robust, high-quality audio and low-power RF capability can make it possible for consumer and automotive original equipment manufacturers (OEMs) to integrate wireless audio technology into portable audio devices and sound systems. Overall, various RF technologies lend themselves to a number of applications in the consumer world to create high-fidelity home theater environments and distribute audio in the home and other environments.

A radio communication system typically requires tuned circuits at both the transmitter and receiver. The transmitter is an electronic device that propagates an electromagnetic signal, representative of an audio signal, for example, typically with the aid of an antenna. An RF transceiver is designed to include both a transmitter and a receiver, combined to share common circuitry, many times appearing on the same piece of Integrated Circuit (IC) chip. If no circuitry is common between transmit and receive functions, the combined device is referred to as a transmitter-receiver. RF Transceivers use RF modules for high-speed data transmission. In most systems, digital processors or processing elements (which are oftentimes software-programmable) are used to perform conversion between digital baseband signals and analog RF, and oscillators are used to generate the required periodic signals.

The receiving end of an RF transceiver system can include an audio output path to reproduce received audio signals. Audio signal reproduction typically involves amplification, which can be performed with the use of class D amplifiers configured in the audio output path. Class D amplifiers are switching amplifiers in which all power devices (e.g. MOSFETs) are operated as binary switches, which are either turned on or turned off, with preferably no time lapse during the transitions between the two states. The power stage structure of class D amplifiers is essentially identical to that of a synchronously rectified buck converter, which is a type of switching power supply. While buck converters usually function as voltage regulators, delivering a constant DC voltage into a variable load while sourcing current to the load, class D amplifiers deliver a constantly changing voltage into a fixed load, with the current and voltage independently changing signs (positive to negative and negative to positive).

Class D amplifiers are mostly used as power amplifiers intended to reproduce signals with a bandwidth well below the switching frequency. The theoretical power efficiency of class D amplifiers is 100%, that is, all power supplied to the amplifier is delivered to the load. In actuality, however, while not 100% efficient, power MOSFETs can still feature efficiencies well over 90%. The binary waveform is typically derived using pulse-width modulation (PWM), pulse density modulation (sometimes referred to as pulse frequency modulation), sliding mode control (also referred to as "self-oscillating modulation") or discrete-time forms of modulation, such as delta-sigma modulation. One way of creating the PWM signal is by comparing a high frequency triangular wave with the audio input, which generates a series of pulses having a duty-cycle that is directly proportional with the instantaneous value of the audio signal. The comparison output is used as a control signal for a MOS gate driver that drives a pair of high-power switches (usually MOSFETs), producing an amplified replica of the PWM signal. An output filter then removes the high-frequency switching components of the PWM signal and recovers the audio information that the speaker can use.

Most often the time resolution afforded by practical clock frequencies is only a few hundredths of a switching period, which is not enough to insure low noise. The pulse length gets quantized, resulting in quantization distortion. Furthermore, the actual output of the amplifier is not only dependent on the modulated PWM signal. Among other things, the output voltage can be directly amplitude-modulated by the power supply voltage, the output impedance may become non-linear due to dead-time errors, and the output filter can have a strongly load-dependent frequency response. One way to combat errors, regardless of their source, is negative feedback, which is implemented by creating a feedback loop that includes the output stage, using a simple integrator. The output filter may be included in the feedback loop by using a PID controller, sometimes with additional integrating terms. However, minimizing output noise and distortion remains a constant challenge.

Other corresponding issues related to the prior art will become apparent to one skilled in the art after comparing such prior art with the present invention as described herein.

SUMMARY OF THE INVENTION

An audio amplifier system may include an audio CODEC/output path with analog class-D amplifiers used for amplifying audio signals. The audio signal may originate as a specified digital audio signal, e.g. a 16-bit Pulse Code Modulated (PCM) audio signal. The digital audio data may be digitally filtered and up-sampled to a specified Audio CLK frequency, and modulated by Multi-loop Noise Shaping (MASH) in the digital audio codec. The filtered, upsampled, and modulated data may drive the input of a Dynamic Element Matching (DEM) circuit, which may generate an output provided to a digital-to-analog converter. The audio path may use Natural Sampling Pulse Width Modulation (PWM) to convert the analog audio signal obtained from the DAC into a series of Rail-to-Rail pulses. The audio signal may be encoded in the average value of the PWM pulse train and may be recovered from the PWM signal by analog low pass filtering. The Class-D amplifiers may be designed with a negative feedback loop/network to compare the output signal with the input signal and suppress non-idealities introduced by the Class-D switching stage. Furthermore, operation of the audio path may be designed according to a separate signal transfer function and a separate noise transfer function, and 2nd order noise shaping may be performed at low power, with an optimized filter included in the feedback loop to achieve the best noise reduction at low power.

The PWM amplifier may use a multiple feedback architecture design to improve performance. The Class-D amplifier network may include two integrators. It may also include a triangle signal generator, comparator and Class-D (PWM) amplifier (which may be modeled as being linearized into a single block representing a D-AMP/PWM Gain block), and a feedback lowpass filter (LPF) with two different feedback positions. The resulting filtering may have the effect of rejecting noise or distortion introduced at the output of the D-AMP/PWM Gain block. The analog signal provided to the analog section (and the PWM feedback loop) may be produced by summing a proportionate number of unit DAC element outputs together to produce a voltage representing the output code of the received digital audio signal. When converting the received digital audio signal, the DEM component may randomize its output bits in a way that "shapes" DAC current source mismatch out of band. A low-pass response of the PWM loop's Signal Transfer Function may reconstruct the signal, and attenuate quantization noise before being driven out to the headphones by the Class-D amplifier.

In one set of embodiments, an audio system may include an audio source configured to generate a digital audio signal in a first format having a resolution of a first number of bits. The audio system may also include an audio path, in which a DEM component may receive the digital audio signal and convert the digital audio signal into a second format having a resolution of a second number of bits. The DEM may randomize an ordering of its output bits with respect to its input bits, and provide the converted digital audio signal through its output bits according to the randomized ordering of the output bits. The audio system may also include a DAC that may receive the converted digital audio signal, and may convert the converted digital audio signal into a corresponding analog signal. Finally, the audio system may include an amplifier network that may receive the analog signal at an input of the amplifier network, and may generate a modulated digital signal based on the analog signal. The amplifier network may include a negative feedback loop between its output and its input, to reconstruct the analog signal from the modulated digital signal while attenuating quantization noise, to produce an amplified driving signal at the output of the amplifier network.

In certain embodiments, the amplifier network includes a first integrator generating a first integrated signal based on the analog input signal and the amplified driving signal, and a second integrator generating a second integrated signal based on the first integrated signal and the amplified driving signal. The amplifier network may generate the modulated digital signal based on the second integrated signal. The amplifier network may also include a Triangle Wave Generator (TWG) to generate a high speed triangle wave signal, and a comparator to compare the second integrated signal to the triangle wave signal to produce a PWM signal as the modulated digital signal. In some embodiments, the second integrator is configured with a passive pole at its output to attenuate noise near a clock frequency of the PWM signal. The amplifier network may further include a class-D amplifier that receives the PWM signal and generates the amplified driving signal from the PWM signal. The PWM signal may be generated as a pair of non overlapping signals, with timing logic delaying edge transitions of the non-overlapping signals to avoid shoot-through current produced during switching of the PWM signal.

A feedback filter may be coupled between the output of the amplifier network and an input of the first integrator, and between the output of the amplifier network and an input of the second integrator, in which case the first integrator may generate the first integrated signal based on the analog input signal and a filtered version of the amplified driving signal, and the second integrator may generate the second integrated signal based on the first integrated signal and the filtered version of the amplified driving signal. The amplified driving signal, that is, the analog audio signal recovered from the amplified PWM signal, may drive a pair of stereo headphones.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
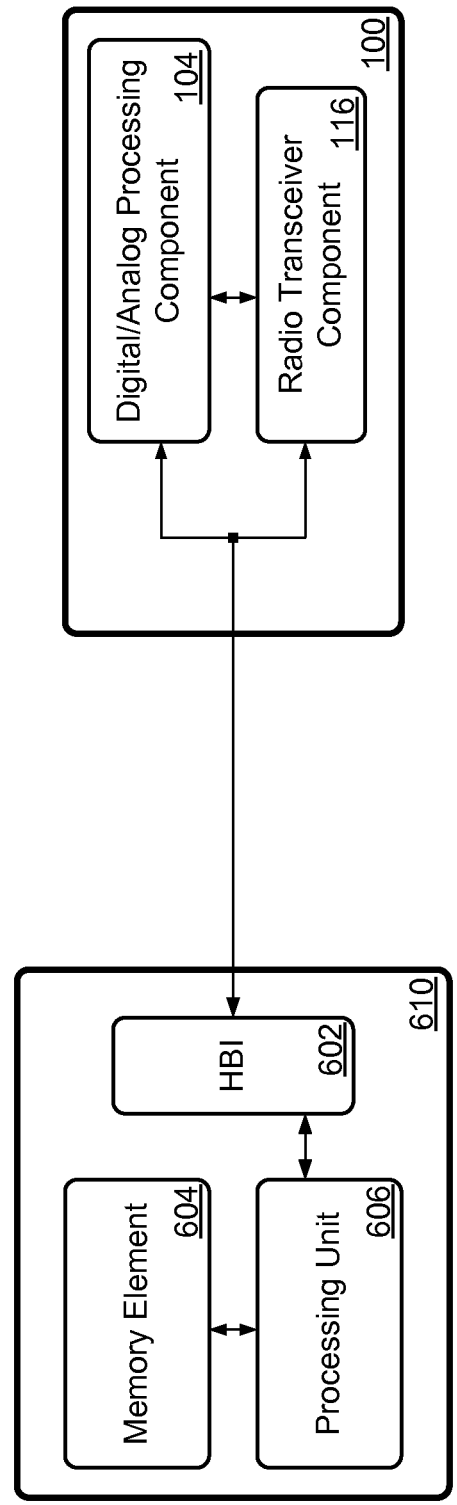
FIG. 1 shows the partial block diagram of one embodiment of a Radio Frequency (RF) system including a host system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

Figure 2:
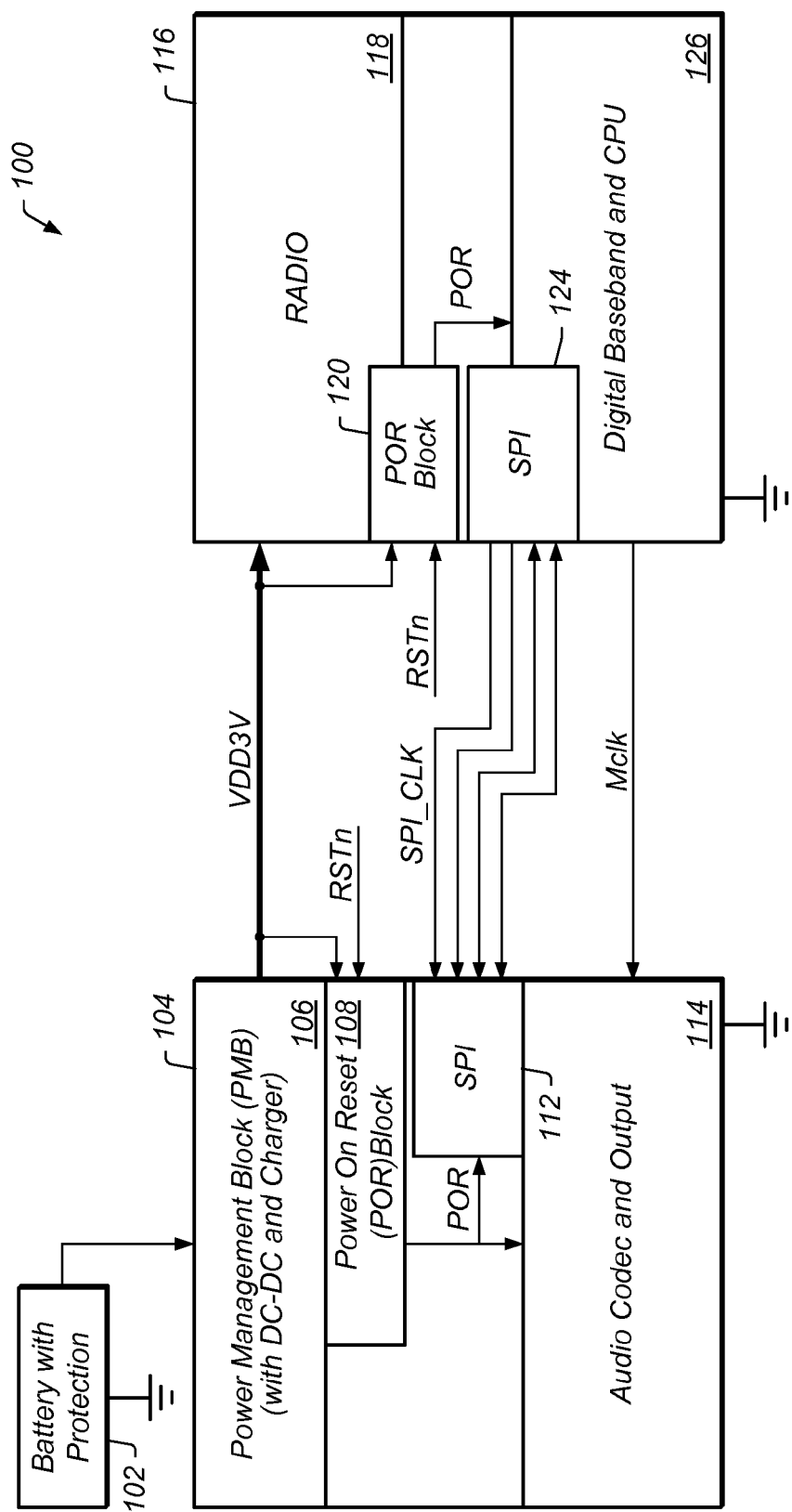
FIG. 2 shows the partial block diagram of one embodiment of an RF transceiver system.

FIG. 1 shows the partial block diagram of one embodiment of a system that includes a Radio Frequency (RF) transceiver system 100 divided into two main functional components: a Digital/Analog Processing Component (DAPC) 104 and a Radio Transceiver Component (RTC) 116. DAPC 104 and RTC 116 may each be configured on an Integrated Circuit (IC) or on respective ICs, and may interface with each other via a number of signals (more details of RF transceiver system 100 are shown in FIG. 2 and are discussed in more detail below). DAPC 104 and RTC 116 may also couple to components of a host system 610 through a host bus interface (HBI) 602. Host system 610 may include one or more memory elements 604 that store program code executable by a processing unit 606 (which may be a general purpose central processing unit, or a microcontroller or some similar component) to perform various control operations on RF transceiver system 100. In turn, RF transceiver system 100 may provide certain feedback signals to host system 610 for bidirectional communication between RF transceiver system 100 and host system 610.

Overview of RF Transceiver System 100

As mentioned above, RF transceiver system 100 may include two main components, DAPC 104 and RTC 116. DAPC 104 itself may include two main blocks. The first block is a Power Management Block (PMB) 106, and the second block is and Audio Output Path (AOP) 114. DAPC may further include a Power On Reset (POR) block 108, and a Serial Peripheral Interface (SPI) 112 to exchange data and information with RTC 116. PMB 106 and AOP 114 may be kept functionally separate, though they may be joined by running the AOP supply with the PMB by using a circuit board connection. PMB 104 may include a DC-DC converter, Battery Charger and Button Control Circuitry (not shown/detailed in FIG. 2). In one set of embodiments, AOP 114 converts serial audio data received via SPI 112 into an analog audio signal, and amplifies the analog audio signal using a high efficiency, class-D headphone driver. RTC 116 may include a Radio Transceiver block 118, a Digital Baseband component 126 (which may also include a CPU), a POR block 120, and an SPI 124 to exchange data and information with DAPC 104.

Control Data and the SPI

The state of DAPC 104 may be controlled by digital input data through register writes. The digital input data may be delivered as low duty-cycle data, and may be provided into a register bank (not shown) inside DAPC 104 by way of SPI 112. Since SPI 112 may be a bidirectional interface, it may also be used to read the state of the register bank. This capability may facilitate the reading of low duty-cycle digital outputs for the purpose of test.

Clocking and Reset for SPI Circuitry

The digital circuitry in DAPC 104 may operate on two clock domains. The incoming SPI_CLK may be used to clock data into an SPI Receive FIFO (not shown) within SPI 112, and out of the SPI Transmit FIFO (not shown) also within SPI 112. The remainder of the digital circuitry, which may include registers, Finite State Machines, the Read Port of Receive FIFO, and the Write Port of the Transmit FIFO) may be clocked by an internal clock (Mclk). The core of SPI 112 may be used to retime signals between the two clock domains. The reset for the circuitry SPI 112 may be completely asynchronous, in which case no clock is used during reset. Registers may reset to their default values, to ensure that analog components remain inactive. The circuitry of SPI 112 (and also that of FSMs) may remain enabled (i.e. it may reset to an enabled state), while the clocks may run during SPI operations.

Audio Data

DAPC 104 may receive a specified digital audio signal, e.g. a 16-bit Pulse Code Modulated (PCM) audio signal through its serial audio port. The digital audio data may be digitally filtered and up-sampled to a specified Audio CLK frequency, and modulated by Multi-loop Noise Shaping (MASH) in the digital audio codec. In some embodiments, the MASH may be a 2-1, 4-bit implementation. The filtered, up-sampled, and modulated data (in case of a 4-bit implementation, the 4 data bits) may drive the input of a dynamic element matcher (DEM), the output of which may be provided to an analog section of DAPC 104.

Clocking

Four clock domains may be implemented for DAPC 104. They four clocks may include a master clock Mclk, an audio clock AudioClk, a DC-DC converter clock clkDCDC, and an SPI clock SPI_CLK. All clocks may be derived from a specified crystal frequency (e.g. 22.5792 MHz, in some embodiments), or an audio clock Phase Locked Loop (PLL) output frequency (e.g. 24.576 MHz in certain embodiments). The AudioClk may be derived by passing the Mclk through a divide-by-two circuit. The AudioClk may drive the DEM and the audio digital to analog converter (DAC). Mclk may be generated by the system clock of RTC 116. Mclk may also be used for much of the digital SPI circuitry, including all registers and any SPI FSM. The branch of the clock tree provided to SPI may be gated, and may toggle only during SPI data transfers. The SPI clock may be synchronous with the Mclk. The DC-DC converter clock may be synchronous to the Mclk, and may default to the AudioClk frequency, to mix power supply noise, possibly generated by the DC-DC converter block within PMB 106, to DC, in order to eliminate any negative impact on audio dynamic range.

Power On Reset and Clocks Valid

DAPC 104 may power up in a low power mode, in which all analog blocks may be disabled, and digital components/circuitry may not be toggling. To accomplish this, POR block 108 within DAPC 104 may generate a POR signal that forces DAPC 104 into a known low power state as soon as the supply voltage VDD3V is valid. Note that in order to simplify the block diagram in FIG. 2, clkDCDC and AudioClk are not shown. During power-up the DC-DC converter may be in full standalone mode, its clock generated locally at start-up. In general, the DC-DC clock may not be involved with the digital core of DAPC 104.

Power Management Block

PMB 106 may be standalone to provide the choice of using either external charger and DC-DC converter, or onboard/on-chip charger/DC-DC converter for battery charging and switching regulator functions. The user may also have the option of using onboard/on-chip DC-DC and external charger, in case batteries other than Li+ ion batteries are used. The functionality of PMB 106 may be controlled through a software algorithm, which may be executed for example by processing unit 606 of FIG. 1, or possibly by the CPU inside Digital Baseband and CPU block 126 of RTC 116.

Audio Output Path

Figure 3:
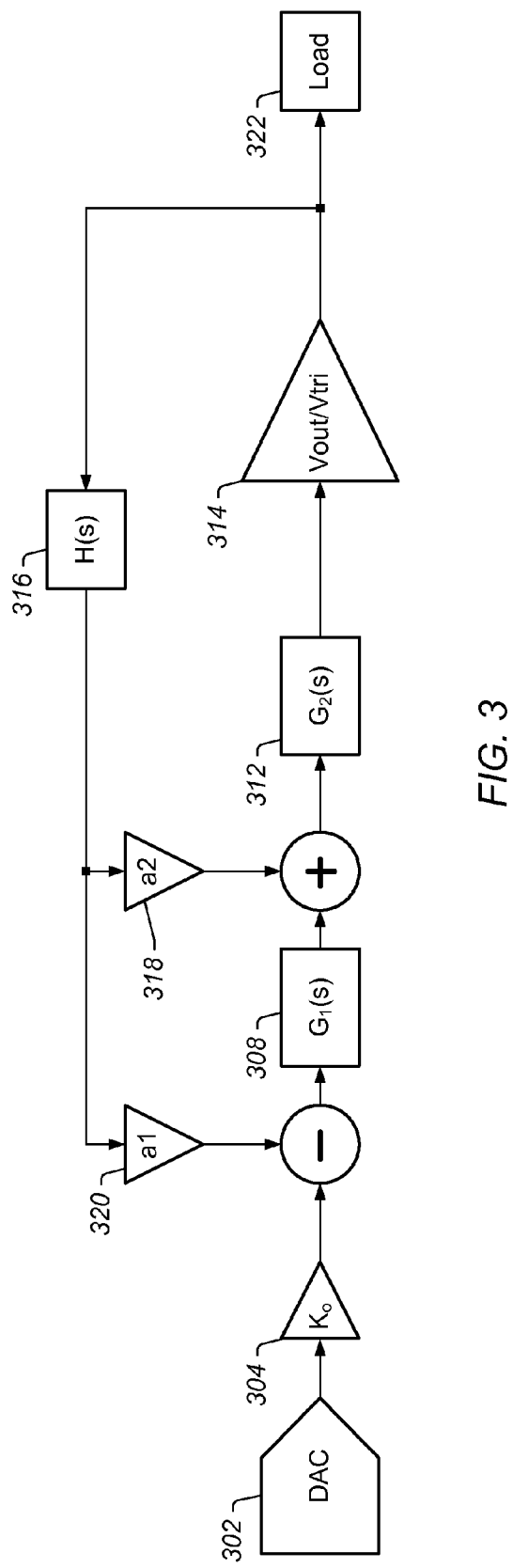
FIG. 3 shows the partial top level circuit diagram of one embodiment of an audio output path included in the Digital/Analog Processing Component of the RF transceiver system of FIG. 2.
Figure 4:
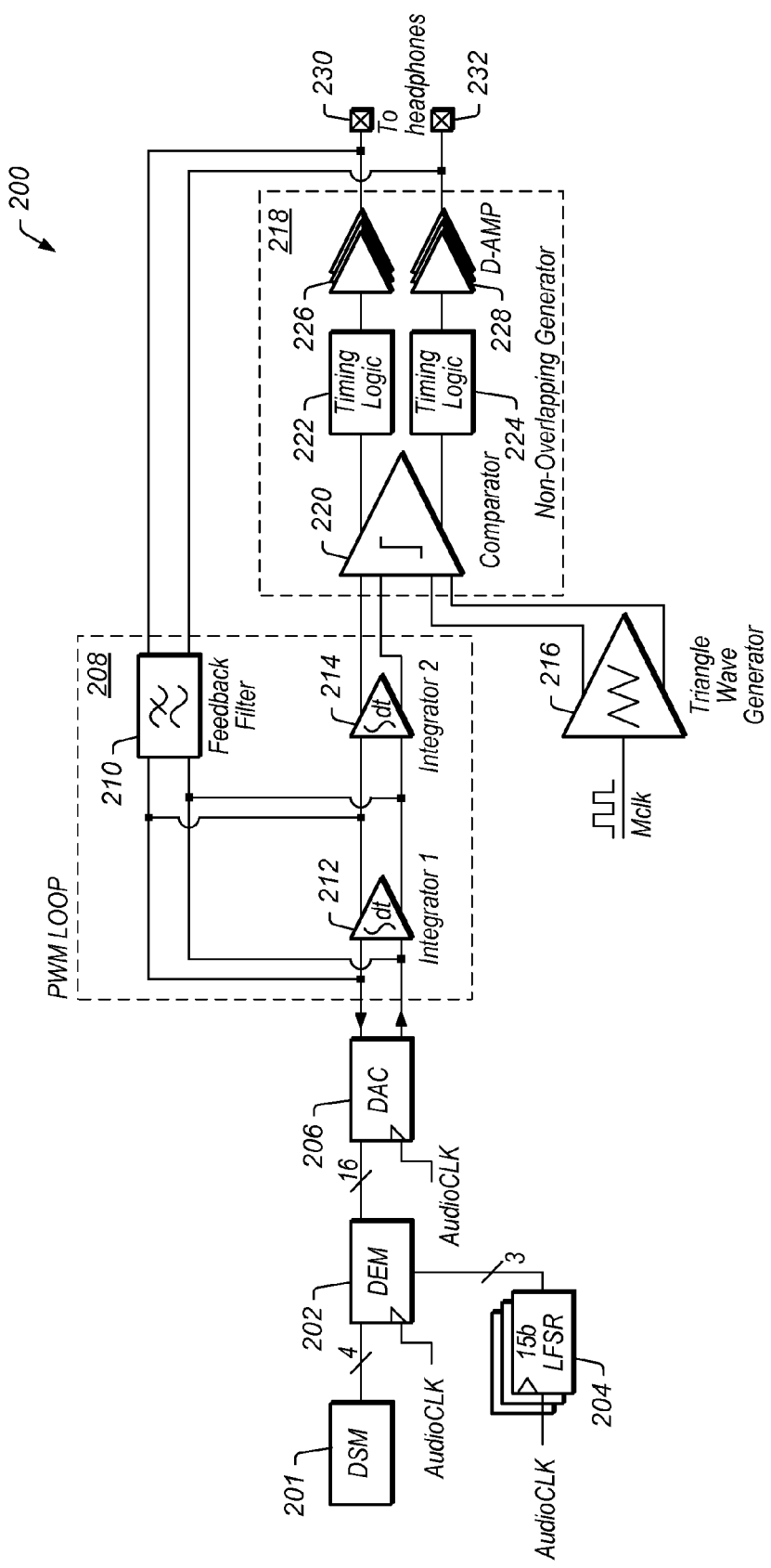
FIG. 4 shows the partial control diagram of one embodiment of a multiple feedback class-D amplifier used in the audio output path of FIG. 3.

In various embodiments, AOP 114 may include a Class-D headphone driver featuring a switching amplifier that uses Natural Sampling Pulse Width Modulation (PWM) to convert an analog input into a series of Rail-to-Rail pulses. The audio signal may be encoded in the average value of the PWM pulse train and may be recovered from the PWM signal by analog low pass filtering at the headphone. Switching amplifiers are known to be efficient (especially if zero voltage switching techniques are used) since voltage drop across the amplifier output stage can be kept low while delivering current to the load. However, switching amplifiers are also known to have impairments that degrade linearity and signal to noise ratio (SNR). Specifically, power supply pushing/glitching and crossover distortion are signal dependent non-idealities that contribute to total harmonic distortion (THD) in audio Class-D amplifiers. In one set of embodiments, a Class-D headphone driver may be designed with a negative feedback network to compare the output signal with the input signal and suppress non-idealities introduced by the Class-D switching stage. A top level linear model and a circuit embodiment of such a driver are shown in FIG. 3 and FIG. 4, respectively.

Supply Noise and Power Supply Rejection Ratio (PSRR)

Supply noise may also be present when the radio (i.e. block 118 in FIG. 2) is in full operation. In some cases, the total audio band noise may integrate over a specified voltage value, e.g. over 300 uVrms. In order to meet noise specifications, the supply noise may need to be lowered (e.g., it may need to be lower than 5 uVrms). Based on analysis according to specific implementation details, which may vary from embodiment to embodiment, a PSRR specification may be obtained for AOP 114. Supply noise may be somewhat attenuated when the supplies are separated, although they may share the same DC-DC converter. For a specified overall attenuation, a corresponding PSSR may need to be specified. For example, for 20 dB attenuation, a further 15 dB of PSRR may be required. This may serve as an overall specification for AOP 114. It should also be noted, that taking into consideration that tones can cause audible audio artifacts, the PSRR specification may be even higher in some embodiments.

Top Level Linear Model

The PWM amplifier mentioned above may use a multiple feedback architecture design to improve performance. As shown in FIG. 3, one embodiment of a multiple feedback Class-D amplifier may include two integrators 308 and 312, a triangle signal generator, comparator and Class-D (PWM) amplifier (all three linearized into a single block 314 representing a D-AMP/PWM Gain Model—more circuit detail is provided in FIG. 4, and will be further discussed below), and a feedback LPF (316) with two different feedback positions (318 and 320, respectively). The resulting filtering may have the effect of rejecting noise or distortion introduced at the output of block 314, i.e. at the output of the comparator/D-AMP. The signal scaling between the PWM loop, Triangle Wave generator and the PWM/D-AMP (comparator to D-AMP) may be complicated by the fact that the loop corrects for changes in the voltage levels.

Regarding various signal and voltage levels, Full Scale may defined as the maximum signal that DAC 302 can provide to gain element 304. By design, this may determine the maximum signal output of the second integrator 312, referenced as Vint. The triangle generator may have an output level that is greater than this, to avoid clipping, which may cause audio distortion, during the PWM generation. The various voltage levels may be specified according to the following equation:

$$V_{out} = V_{int} \cdot \frac{V_{AMP}}{V_{TRI}}, \quad (1)$$

where $V_{out}$ corresponds to the output of 314, $V_{int}$ corresponds to the output of integrator 312, and the ratio of $V_{AMP}$ and $V_{TRI}$ corresponds to the PWM gain. The following are example peak voltage values according to one embodiment:

(A) $V_{int}$=0.45 Vpk
(B) $V_{TRI}$=0.55 Vpk
(C) $V_{out}$=1.115 Vpk

Value (A) may be specified to not be greater than (B), or at Full Scale the PWM generation might break down. Actual changes to the PWM gain ($V_{AMP}/V_{TRI}$) are absorbed and corrected for by the (feedback) loop. The output voltage may remain almost constant, and the input voltage ($V_{int}$) may change over corners. $V_{AMP}$ may be considered the "effective" VDD of the D-AMP. That is, if the Comparator/D-AMP were ideal, that is the supply level that would yield the same output signal.

DEM and Randomizer Specification

As previously mentioned, FIG. 4 shows a more detailed circuit diagram of the multiple feedback Class-D amplifier structure used in some embodiments of AOP 114. A Dynamic Element Matching (DEM) block 202 may be positioned between the output of a delta sigma modulator (DSM) and the input of the digital to analog converter (DAC) 206 as shown in FIG. 4. DEM 202 may be clocked by the AudioCLK clock signal. There may be a couple of reasons for this configuration. First, the 4-bit binary encoded output from DSM 201 may be converted into a 16-bit thermometer encoded signal which drives DAC 206 (it should be noted again that the processed digital audio signal may be of any specified bit length and may be processed as desired, however, for the purposes of illustration, a 4-bit signal is described herein according to one set of embodiments). The analog signal may then be produced by summing a proportionate number of unit DAC element outputs together to produce a voltage representing the output code of DSM 201. The unit elements of DAC 206 may deviate from their ideal values, which may cause tones and increased noise in the output spectrum, which provides the second reason for the configuration of DEM block 202.

While converting the 4-bit binary number to a 16-bit thermometer code, DEM 202 may randomize its output bits in a way that "shapes" DAC current source mismatch out of band. This may in turn relax the requirement on current source element matching in DAC 206. For example, if the output code from DSM 201 represents the number 2, and a simple thermometer decoder is used instead of DEM 202 to convert this binary signal to a thermometer code by activating outputs 1 and 2 every time the input code is 2, then the final DAC output error resulting from the finite mismatch associated with DAC elements 1 and 2 may cause output noise, and a periodic tone corresponding to the period between the occurrence of the number 2 at the output of DSM 201. In contrast, by using a DEM block 202 to convert the binary number 2 by selecting any 2 of the 16 possible unit DAC elements at random, the error in the final DAC output signal may be spread out in the frequency domain, and the erroneous periodic tone that coincides with the frequency of the number 2 occurring at the output of DSM 210 may be eliminated. If the selection of DAC elements is not "random" but involves knowledge of previously selected elements (through memory and feedback, i.e. in a dynamic system), then noise shaping may be performed.

Note that DEM 202 may require three uncorrelated random input bits to perform its noise shaping. Recognizing the tradeoff between power consumption and periodicity of Linear Feedback Shift Registers (LFSRs), LFSRs 204 may be designed to have a specified length. In the embodiment of FIG. 4, LFSRs 204 has been specified to have 15 bits, where each LFSR may have a unique and maximal length tap sequence. For example, with a clock frequency of 2.8 MHz, the LFSRs may repeat every 86 Hz. An A-weighted filter may provide ~20.6 dB of attenuation at 90 Hz, thus a length of 15 bits for LSFRs 204 proves to be sufficient.

Audio DAC Specification

Requirements for DAC 206 may be difficult to separate from the PWM loop total since they may be tightly coupled. DAC 206 may feed current directly into the PWM loop 208, and specifications may be referred to the input of DAC 206 or the output of the closed PWM loop 208 (with linear gain in place of the PWM D-AMP). As mentioned above, the up-sampled, DSM "encoded", audio PCM data may be processed by DEM 202, which may drive the current steering DAC 206, which may operate to convert the signal into a sample-and-held analog domain signal. The current output of DAC 206 may be driven into the virtual ground node of the first integrator 212 in PWM loop 208. The low-pass response of the PWM loop's Signal Transfer Function (STF) may reconstruct the signal, and attenuate DSM quantization noise before being driven out to the headphones by the Class-D amplifier 226/228 via stereo terminals 230/232, respectively. Further filtering of the DSM noise may be required at the output of Class-D amplifier 226.

In one set of embodiments, current steering DAC 206 is a differential 16-level unary (thermometer) DAC. Each of 16 PMOS unit current sources within DAC 206 may be steered to, and summed at, the virtual ground nodes of first integrator 212 as a function of input code. A specially designed latch may be used to control the crossing point of the "bit switch". To ensure low glitching energy, the bit-switches may be operated to not have both switches in the "off" position during a bit transition. For example, an input code of 0000 may correspond to all current sources switched negative, an input code of 1000 may correspond to zero (differential signal), and an input code of 1111 may correspond to all current sources switched positive. DSM 201 may be designed such that not all codes of DAC 206 are exercised for a "full scale" signal. For example, only 11 out of 16 possible levels may be used, or, more generally, only a specified number of all available levels of DAC 206 are used for representing a full scale signal.

PWM Loop Specification

Regarding PWM loop 208, a passive pole may be created at the output of second integrator 214 to attenuate noise near the PWM clock frequency. The feedback filter 210 may be placed in a multi-feedback configuration. In one embodiment, feedback filter 210 may be a second order Butterworth filter with a unit DC gain of and 3 dB bandwidth of 900 kHz. To maintain the loop parameters in single-ended mode, external resistors and capacitors (not shown) may be used. The DC gain of feedback filter 210 in single-ended mode may be twice that of differential mode, as a result of the external resistors, which may compensate for an effectively halved output of D-AMPS 226/228 (the D-AMP output is effectively half when considered differentially). To enable single-ended mode, extra circuitry (not shown) may be used, and a bias onboard DAPC 104 may be enabled.

Triangle Wave Generator

Triangle Wave generator (TWG) block 216 may be used for encoding audio data to naturally sampled PWM, such that the highly-efficient class-D audio amplifiers 226/228 may be used to amplify the signal and drive the earphone load through terminals 230/232, respectively. The only input to the TWG 216 (other than biases, an enable and an amplitude control word) may be the specified Mclk signal (which, in some embodiments, may be a 5.6448 MHz or 6.144 MHz clock signal, as previously mentioned). The output fundamental of TWG 216 may be one half that of the specified input frequency, and may set the PWM natural sampling frequency. A local divide-by-2 block may be used within TWG 216 to generate the correct output frequency, facilitating the relaxing of the duty cycle specification of the input clock. The output of TWG 216 may drive the input of comparator circuits 220. Specifically, TWG 216 may drive both the right and left channel comparators (shown as comparators 220). The output amplitude of the outputs of TWG 216 may be specified to be larger than that of the left and right audio signals under all operating conditions, to ensure correct PWM data at the output of each comparator.

Comparator and Non-Overlapping Generator

Comparator (or comparators) 220 may compare the incoming analog audio signal received from integrator 214 to the high-speed, triangle wave signal received from TWG 216, to generate a PWM signal that may be efficiently amplified. A single comparator may be used per channel, when using a bipolar PWM scheme, where +ve and −ve inputs to the output stage are driven by +ve and −ve outputs of the comparator. With a unipolar PWM scheme, two comparators may be used per channel. In one set of embodiments, switching logic may be implemented to support both bipolar and unipolar PWM schemes. For single-ended output, a single comparator per channel may be used. In this scenario, only one output (e.g., +ve) may be used to drive the output stage. The non-overlapping PWM circuit may generate two digital outputs whose edge transitions are delayed with respect to each other by what is referred to as a "dead-time", through timing logic 222/224. The dead-time in the transitions avoids shoot-through currents that may damage the output stage of Class-D amplifiers 226/228. However, the output of a Class-D amplifier may feature a high-impedance output region, which may result in distortion when driving a reactive load. The non-overlapping PWM circuit may use conventional techniques—e.g., delay cells (CMOS inverters with MOS capacitor loads) and feedback. The circuit may be designed with programmable dead-time, in discrete specified size and number steps, for example from 0 ns to 20 ns. Transmission gates may be employed to switch a load capacitance in and out. For 0ns dead-time, load capacitance is minimized, and the feedback loop is opened.

Class-D Amplifier

In one set of embodiments, Class-D amplifiers 226/228 may be designed to support stereo headphones, for example stereo headphones with 3-pin (L+, R+, L−/R− common return) and 4-pin (L+, L−, R+, R−) connectors. The amplifier's primary design goals may include high efficiency, and in conjunction with the analog correction loop, high linearity and low noise. The differential output stage of each channel may be designed as a "classic" H-bridge configuration, utilizing 1.8V CMOS devices. For headphones with 3-pin connectors, where L- and R-terminals are shared, only one side of the bridge output may be used. In addition, some adjustability may also be available in the amplitude of TWG 216 to offset gain variation of the output stage. Bipolar PWM may be employed by default, where the high-frequency (switching) component of the PWM signal is applied across the load. Unipolar PWM may be used in newer Class-D amplifier designs, where the high-frequency component is applied in common-mode across the load. The amplifier (226/228) may be designed to support both bipolar and unipolar PWM schemes. High-frequency energy beyond the audio band may be filtered by a low-pass filter (e.g., LC). AC coupling may be used for single-ended output and, while not necessary, it may also be used with differential outputs.

To minimize shoot-through currents, which reduce efficiency and may damage DAPC 104 (which may be an IC), a non-overlapping clock scheme may be applied to the PWM signals. As mentioned above, the non-overlapping clock circuit may create a dead-time between turn-off and turn-on of the output stage's devices. Unfortunately, this may result in signal non-linearity when driving reactive loads (e.g., headphone+LC low-pass filter). It may also introduce additional delay through the signal path, of approximately ½ of the dead-time plus gate delays. Thus, as also previously mentioned, amplifier 226/228 may be designed to operate at specified dead-time steps, which may allow fine tuning of performance during operation. The dead-time may also result in higher supply voltage spikes, as during the dead-time energy circulates in the output LRC (inductive/resistive/capacitive) network. Shunt switches at the differential outputs may be actuated during dead-time to reduce supply spiking and distortion, which may be implemented as a selectable function that is not used during normal operation.

Power Supply Signals

Different supply signals (VDD) may be provided to AOP 114. In one set of embodiments, a different respective supply voltage may be provided to various single components or groups of components of AOP 114. For example, a first supply voltage may be provided to DEM 202 and DAC 206, a second supply voltage may also be provided to DAC 206, as well as to components within PWM loop 208, a third supply voltage may be provided to comparator 220, a fourth supply voltage may be provided to amplifiers 226/228, and a fifth supply voltage may be provided to TWG 216. In addition, a sixth supply voltage may be provided to LFSR 204, comparator 220, timing logic 222/224, and also to amplifiers 226/228. The first, second, third, and fourth supply voltages may also be separate for left and right channels, while the fifth and sixth supply voltages may be common to both left and right channels. Each supply voltage may have a corresponding ground (GND) signal. In most cases the ground signals may all be bonded to a die attach pad, and each VDD signal may be kept separate on the board with one or more decoupling capacitors. In the specific case of the Class-D AMP, its associated ground may be bonded out to a signal trace on the board not the die attach pad. This may be performed to minimize coupling through ground. Quiet Grounds (or QGNDs) may also be used to tie the substrate to the ground die attach pad. These may be placed on various levels of the layout depending on size and proximity to other blocks. In addition, reference currents (sourced and sinked) may be routed to each circuit block for local mirroring, to mitigate the need for low supply resistance, and enable better matching of current mirror transistors within the blocks. Current references may be generated through bandgap reference, and may both be constant current and on-chip resistor referenced.

Click and Pop Suppression

PWM loop transients may need time to settle on start-up (i.e., when the loop is first closed). An auxiliary loop may therefore be added—in addition to PWM loop 208—for this purpose, to ensure that the load, e.g. the headphones are not being driven while the loop is settling (i.e., signal path start-up transients may be perceived as a "pop"). Zero input signal may be passed through DAC 206 during this start-up mode. The main loop may then be closed and the auxiliary loop opened. This may be performed after a predetermined time to allow the differential loop to completely settle. Common-mode settling at the output filter of D-AMPs 226/228 may not present an issue (during loop switching) when the load, e.g. the headphones are configured in differential mode, although it may be beneficial to mute the audio during settling to allow the PWM loop to settle with zero signal.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An audio processing system comprising:
   a dynamic element matching (DEM) component having an output comprising a first number of bits, and further having an input comprising a second number of bits configured to receive a digital audio signal in a first format, wherein the DEM component is configured to:
      convert the digital audio signal into a second format;
      while converting the digital audio signal into the second format, randomize an ordering of the output bits of the DEM component with respect to the input bits of the DEM component; and
      provide the converted digital audio signal through the output bits of the DEM component according to the randomized ordering of the output bits of the DEM component;
   a digital-to-analog converter (DAC) having an input comprising a first number of bits configured to receive the converted digital audio signal from the DEM component, wherein the DAC is configured to convert the converted digital audio signal into a corresponding analog signal; and
   an amplifier network having an input configured to receive the analog signal and generate a modulated digital signal based on the analog signal, wherein the amplifier network comprises a negative feedback loop between an output of the amplifier network and the input of the amplifier network, implementing a transfer function configured to reconstruct the analog signal from the modulated digital signal while attenuating quantization noise to produce an amplified driving signal at the output of the amplifier network.

2. The audio processing system of claim 1, wherein the negative feedback loop is a Pulse Width Modulation loop.

3. The audio processing system of claim 1, wherein the amplifier network comprises:
   a first integrator configured to produce a first integrated signal based on a difference of the analog input signal and a filtered version of the amplified driving signal; and
   a second integrator configured to produce a second integrated signal based on a sum of the first integrated signal and the filtered version of the amplified driving signal;
   wherein the amplifier network is configured to generate the modulated digital signal based on the second integrated signal.

4. The audio processing system of claim 3, wherein the amplifier network further comprises a Triangle Wave Generator (TWG) configured to generate a high-speed triangle wave signal; and
   a comparator configured to compare the second integrated signal to the triangle wave signal to encode the analog signal into a naturally sampled PWM signal which is the modulated digital signal;
   wherein the amplifier network is configured to generate the amplified driving signal based on the PWM signal.

5. The audio processing system of claim 4, wherein the second integrator is configured with a passive pole at its output to attenuate noise near a clock frequency of the PWM signal.

6. The audio processing system of claim 4, wherein the amplifier network further comprises a class-D amplifier configured to receive the PWM signal and generate the amplified driving signal from the PWM signal.

7. The audio processing system of claim 4, wherein the PWM signal comprises a pair of non-overlapping signals, wherein the amplifier network further comprises timing logic configured to delay edge transitions of the non-overlapping signals to avoid shoot-through current produced during switching of the PWM signal.

8. The audio processing system of claim 4, wherein an output fundamental of the TWG is one half that of a specified input frequency of a clock signal used for clocking the TWG, to set a natural sampling frequency of the PWM signal.

9. The audio processing system of claim 4, wherein the amplifier network further comprises a feedback filter coupled between the output of the amplifier network and an input of the first integrator, and between the output of the amplifier network and an input of the second integrator.

10. The system of claim 4, wherein the amplifier network further comprises a feedback filter coupled between the output of the amplifier network and an input of the first integrator, and between the output of the amplifier network and an input of the second integrator;
    wherein the first integrator is configured to produce the first integrated signal based on the analog input signal and a filtered version of the amplified driving signal, and wherein the second integrator is configured to produce the second integrated signal based on the first integrated signal and the filtered version of the amplified driving signal.

11. A method for reducing noise at low power operation of a class-D amplifier amplifying an audio signal, the method comprising:
    receiving a digital audio signal in a first format at an input of a dynamic element matching (DEM) component, wherein the DEM component has an output comprising a first number of bits, and wherein the input of the DEM comprises a second number of bits;

the DEM component converting the digital audio signal into a second format, comprising randomizing an ordering of the output bits of the DEM component with respect to the input bits of the DEM component;

the DEM component providing the converted digital audio signal through the output bits of the DEM component according to the randomized ordering of the output bits of the DEM component;

receiving the converted digital audio signal at the input of a digital-to-analog converter (DAC), wherein the input of the DAC comprises a first number of bits;

the DAC converting the converted digital audio signal into a corresponding analog signal;

generating a modulated digital signal based on the analog signal;

producing an amplified driving signal by reconstructing the analog signal from the modulated digital signal and attenuating quantization noise.

12. The method of claim 11, wherein said generating and said producing are performed in a negative feedback loop configured to compare the analog signal and the amplified driving signal to suppress non-idealities introduced during said reconstructing.

13. The method of claim 11, further comprising:
producing a first integrated signal based on a difference of the analog input signal and a filtered version of the amplified driving signal; and
producing a second integrated signal based on a sum of the first integrated signal and the filtered version of the amplified driving signal;
wherein said generating comprises generating the modulated digital signal from the second integrated signal.

14. The method of claim 13, wherein said generating the modulated digital signal comprises:
generating a high-speed triangle wave signal; and
encoding the analog signal into a naturally sampled PWM signal by comparing the second integrated signal to the triangle wave signal; and
providing the PWM signal as the modulated digital signal.

15. The method of claim 14, further comprising:
receiving the PWM signal at an input of a class-D amplifier; and
the class-D amplifier generating the amplified driving signal from the PWM signal.

16. The method of claim 14, wherein said providing the PWM signal comprises providing a pair of non-overlapping signals, comprising delaying edge transitions of the non-overlapping signals to avoid shoot-through current produced during switching of the PWM signal.

17. A system comprising:
an audio source configured to generate a digital audio signal in a first format having a resolution of a first number of bits; and
an audio path comprising:
a dynamic element matching (DEM) component configured to:
receive the digital audio signal and convert the digital audio signal into a second format having a resolution of a second number of bits;
randomize an ordering of output bits of the DEM component with respect to input bits of the DEM component; and
provide the converted digital audio signal through the output bits of the DEM component according to the randomized ordering of the output bits of the DEM component;
a digital-to-analog converter (DAC) configured to receive the converted digital audio signal, and further configured to convert the converted digital audio signal into a corresponding analog signal; and
an amplifier network configured to receive the analog signal at an input of the amplifier network, and further configured to generate a modulated digital signal based on the analog signal, wherein the amplifier network comprises a negative feedback loop between an output of the amplifier network and the input of the amplifier network to reconstruct the analog signal from the modulated digital signal while attenuating quantization noise, to produce an amplified driving signal at the output of the amplifier network.

18. The system of claim 17, wherein the negative feedback loop is a Pulse Width Modulation loop.

19. The system of claim 17, wherein the amplifier network comprises:
a first integrator configured to produce a first integrated signal based on the analog input signal and the amplified driving signal; and
a second integrator configured to produce a second integrated signal based on the first integrated signal and the amplified driving signal;
wherein the amplifier network is configured to generate the modulated digital signal based on the second integrated signal.

20. The system of claim 19, wherein the amplifier network further comprises a Triangle Wave Generator (TWG) configured to generate a high-speed triangle wave signal; and
a comparator configured to compare the second integrated signal to the triangle wave signal to produce a PWM signal as the modulated digital signal.

21. The system of claim 20, wherein the second integrator is configured with a passive pole at its output to attenuate noise near a clock frequency of the PWM signal.

22. The audio processing system of claim 20, wherein the amplifier network further comprises a class-D amplifier configured to receive the PWM signal and generate the amplified driving signal from the PWM signal.

23. The audio system of claim 20, wherein the PWM signal comprises a pair of non-overlapping signals, wherein the amplifier network further comprises timing logic configured to delay edge transitions of the non-overlapping signals to avoid shoot-through current produced during switching of the PWM signal.

24. The system of claim 20, wherein an output fundamental of the TWG is one half of a fundamental of a specified input frequency of a clock signal used for clocking the TWG, to set a natural sampling frequency of the PWM signal.

25. The system of claim 17, further comprising a load coupled to the output of the amplifier network to be driven by the amplified driving signal.

26. The system of claim 25, wherein the load is a pair of stereo headphones.

* * * * *

UNITED STATES PATENT AND TRADEMARK OFFICE
CERTIFICATE OF CORRECTION

| | | |
|---|---|---|
| PATENT NO. | : 8,553,909 B2 | Page 1 of 1 |
| APPLICATION NO. | : 13/097690 | |
| DATED | : October 8, 2013 | |
| INVENTOR(S) | : Justin L. Fortier et al. | |

It is certified that error appears in the above-identified patent and that said Letters Patent is hereby corrected as shown below:

Title Page, Item (75), Inventors, 4th inventor, "Christoper A. DeVries, Ottowa (CA)," should read "Christopher A. DeVries, St. Thomas (CA)"

Signed and Sealed this
Tenth Day of December, 2013

Margaret A. Focarino
*Commissioner for Patents of the United States Patent and Trademark Office*